United States Patent
Kuo et al.

(10) Patent No.: US 10,964,860 B2
(45) Date of Patent: Mar. 30, 2021

(54) METHOD OF PACKAGING SEMICONDUCTOR ILLUMINATION MODULE

(71) Applicant: Primax Electronics Ltd., Taipei (TW)

(72) Inventors: Hung-Wei Kuo, Taipei (TW); Ya-Chin Tu, Taipei (TW); Chung-Yuan Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 16/422,800

(22) Filed: May 24, 2019

(65) Prior Publication Data

US 2020/0295243 A1 Sep. 17, 2020

(30) Foreign Application Priority Data

Mar. 15, 2019 (TW) ................................ 108108944

(51) Int. Cl.
*H01L 33/54* (2010.01)
*H01L 33/62* (2010.01)
(Continued)

(52) U.S. Cl.
CPC .......... *H01L 33/54* (2013.01); *H01L 33/0095* (2013.01); *H01L 33/56* (2013.01); *H01L 33/62* (2013.01); *H01L 2933/005* (2013.01)

(58) Field of Classification Search
CPC ................. H01L 33/08; H01L 25/0753; H01L 2924/0002; H01L 2933/0075; H01L 2933/0066; H01L 2933/0033; H01L 33/62; H01L 33/60; H01L 33/507; F21K 9/64; F21K 9/20; F21Y 2107/90; F21Y 2115/10; F21S 8/06; H01S 5/4025
See application file for complete search history.

(56) References Cited

U.S. PATENT DOCUMENTS

| | | | | |
|---|---|---|---|---|
| 2009/0026485 | A1* | 1/2009 | Urano | H01L 33/483 257/99 |
| 2010/0078655 | A1* | 4/2010 | Yang | H01L 23/49816 257/81 |

(Continued)

FOREIGN PATENT DOCUMENTS

| | | | |
|---|---|---|---|
| KR | 2012052813 | * | 5/2012 |
| KR | 20130102296 A | * | 9/2013 |

OTHER PUBLICATIONS

Machine translated document (KR20130102296A) (Year: 2013).*

*Primary Examiner* — Ahmed N Sefer
(74) *Attorney, Agent, or Firm* — Kirton McConkie; Evan R. Witt

(57) ABSTRACT

A method of packaging a semiconductor illumination module is provided. The method includes the following steps. In a step (a), a substrate is provided. The substrate is selected from one of a flexible printed circuit board, a metal core circuit board, a printed circuit board or a ceramic printed circuit board. The substrate includes a solder mask layer with an opening, and the opening has a width R. In a step (b), a light-emitting element is installed in the opening. In a step (c), an encapsulant injection device is used to inject a packaging encapsulant into the opening. In a step (d), a sealed lens structure is formed to cover the light-emitting element, wherein the sealed lens structure has a height h.

8 Claims, 3 Drawing Sheets

(51) Int. Cl.
  *H01L 33/56*    (2010.01)
  *H01L 33/00*    (2010.01)

(56) References Cited

U.S. PATENT DOCUMENTS

2011/0198631 A1*  8/2011  Lerman ..................... F21K 9/64
                                                             257/91
2015/0021628 A1*  1/2015  Medendorp, Jr. ....... H01L 33/56
                                                             257/88
2018/0019384 A1*  1/2018  Abe ........................ H01L 33/54

* cited by examiner

METHOD OF PACKAGING SEMICONDUCTOR ILLUMINATION MODULE

FIELD OF THE INVENTION

The present invention relates to a method of packaging an electronic device, and more particularly to a method of packaging a semiconductor illumination module.

BACKGROUND OF THE INVENTION

Nowadays, the trend of designing electronic device is toward miniaturization. The thickness of the circuit board of the electronic device is gradually reduced. Consequently, the arrangement of the conductor lines and the connecting terminals on the circuit board becomes more crowded and complicated and the electronic components (e.g., light-emitting elements) become smaller. Since the size of the light-emitting element is gradually decreased, the demand on the assembling precision of the light-emitting element is gradually increased.

Conventionally, the light-emitting element (e.g., a LED die) on a substrate is packaged by a resin transfer molding technology. Consequently, a sealed lens structure that covers the light-emitting element is formed. The light beam from the light-emitting element can be gathered by the sealed lens structure.

However, since the conductor lines and the connecting terminals are too crowded, the assembling complexity of using the resin transfer molding technology is increased.

For solving the above drawbacks, there is a need of providing a method of packaging a semiconductor illumination module in a simpler and quicker manner while forming a sealed lens structure with adjustable profile and height.

SUMMARY OF THE INVENTION

The present invention provides a method of packaging a semiconductor illumination module in a simpler and quicker manner and forming a sealed lens structure with adjustable profile and height. Consequently, the light-gathering efficiency of the light-emitting element is adjustable.

In accordance with an aspect of the present invention, a method of packaging a semiconductor illumination module is provided. The method includes the following steps. In a step (a), a substrate is provided. The substrate is selected from one of a flexible printed circuit board, a metal core circuit board, a printed circuit board or a ceramic printed circuit board. The substrate includes a solder mask layer with an opening, and the opening has a width R. In a step (b), a light-emitting element is installed in the opening. In a step (c), an encapsulant injection device is used to inject a packaging encapsulant into the opening. In a step (d), a sealed lens structure is formed to cover the light-emitting element, wherein the sealed lens structure has a height h.

In the step (a), the substrate further includes a circuit layer, and a portion of the circuit layer is exposed to the opening.

In an embodiment, the light-emitting element includes at least one light emitting diode die and at least two solder pads, and the at least one light emitting diode die is electrically connected with the circuit layer through the at least two solder pads.

In the step (c), the packaging encapsulant is epoxy-hybrid material, silicone-hybrid material, epoxy resin, silicone resin, acrylic hybrid material or UV curing glue. The packaging encapsulant contains diffusion particles. The diffusion particles are made of calcium carbonate ($CaCO_3$), titanium dioxide ($TiO_2$), silicon dioxide ($SiO_2$), aluminum oxide ($Al2O_3$), boron nitride (BN), zinc oxide (ZnO) or zirconium oxide ($ZrO_2$).

Preferably, in the step (a), the width R is 0.7 mm.

Preferably, in the step (c), a diameter of an encapsulant injection port of the encapsulant injection device is in a range between 0.1 mm and 0.3 mm.

Preferably, in the step (c), a viscosity of the packaging encapsulant is in a range between 3000 Pa·s and 10000 Pa·s, and a thixotropic coefficient of the packaging encapsulant is in a range between 1.5 and 2.8.

In an embodiment, the diameter of the encapsulant injection port of the encapsulant injection device is in a range between 0.1 mm and 0.2 mm, the viscosity of the packaging encapsulant is in a range between 3000 Pa·s and 8500 Pa·s, and the thixotropic coefficient of the packaging encapsulant is in a range between 1.5 and 3.0. Consequently, the height h of the sealed lens structure is about 0.15 mm.

In an embodiment, the diameter of the encapsulant injection port of the encapsulant injection device is in a range between 0.2 mm and 0.3 mm, the viscosity of the packaging encapsulant is in a range between 6000 Pa·s and 15000 Pa·s, and the thixotropic coefficient of the packaging encapsulant is in a range between 2.4 and 3.0. Consequently, the height h of the sealed lens structure is about 0.35 mm.

In an embodiment, the diameter of the encapsulant injection port of the encapsulant injection device is in a range between 0.2 mm and 0.3 mm, the viscosity of the packaging encapsulant is in a range between 3000 Pa·s and 7000 Pa·s, and the thixotropic coefficient of the packaging encapsulant is in a range between 1.5 and 1.9. Consequently, the height h of the sealed lens structure is about 0.15 mm.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
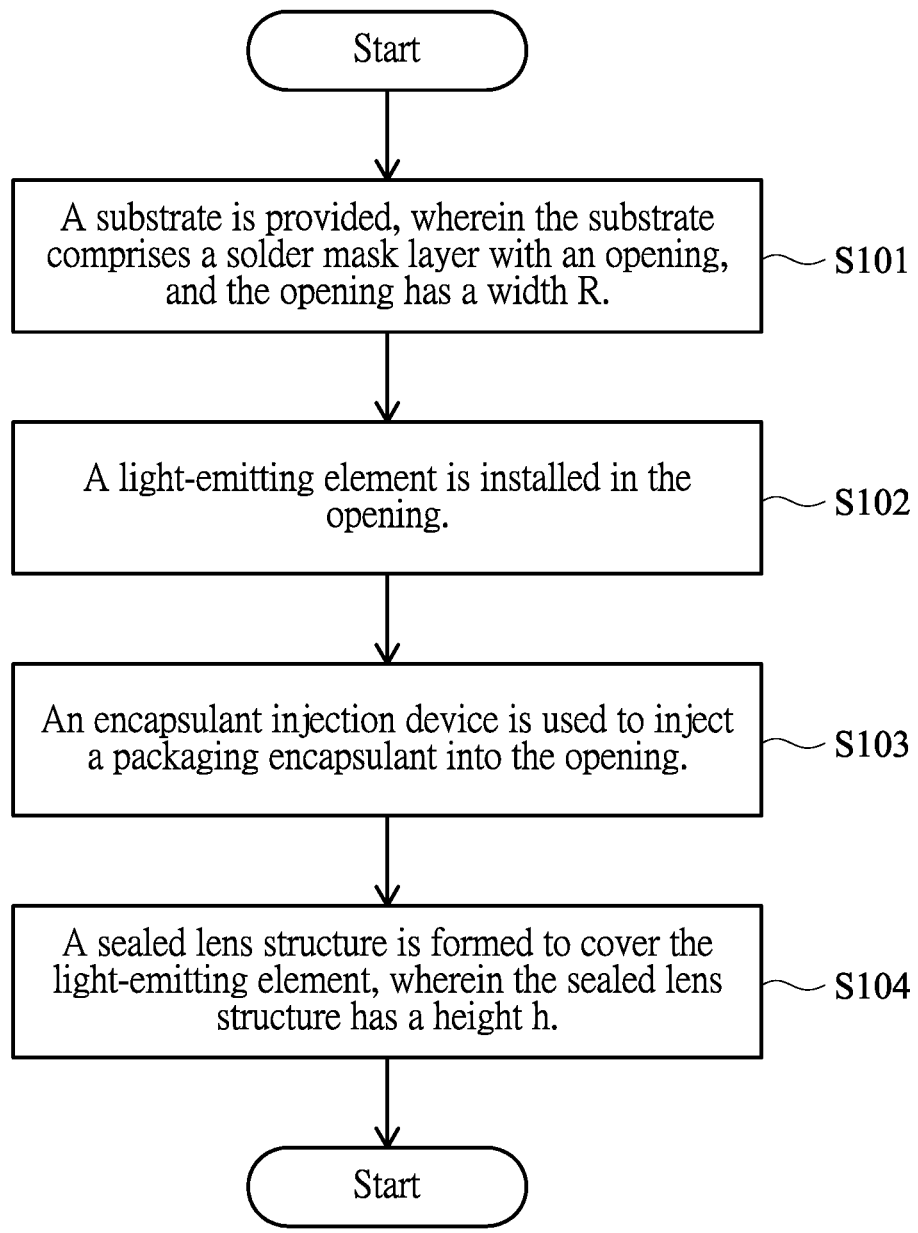
FIG. 1 is a flowchart illustrating a method of packaging a semiconductor illumination module according to an embodiment of the present invention.
Figure 2:
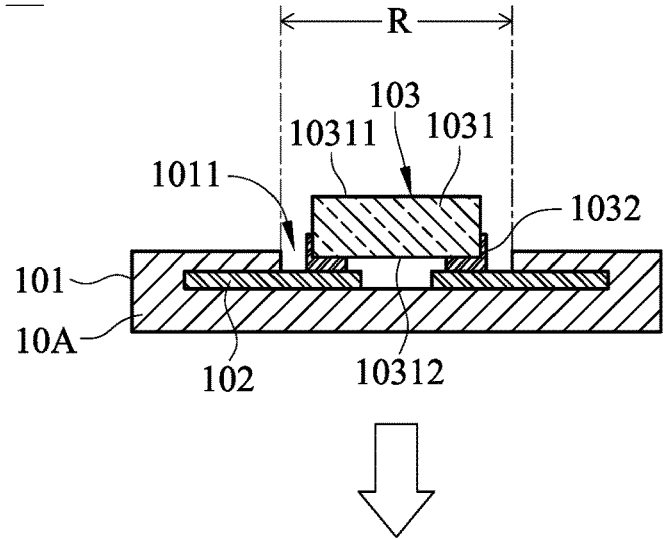
FIG. 2 schematically illustrates the steps of the method of packaging the semiconductor illumination module according to the embodiment of the present invention.
Figure 2:
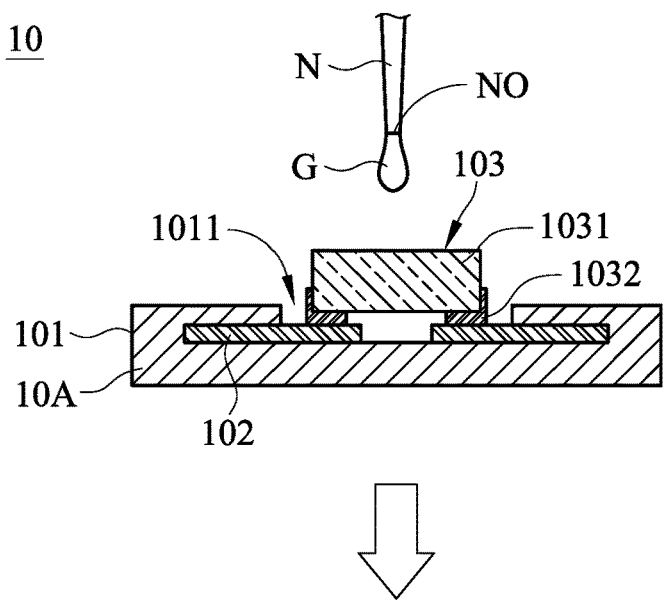
Figure 2:
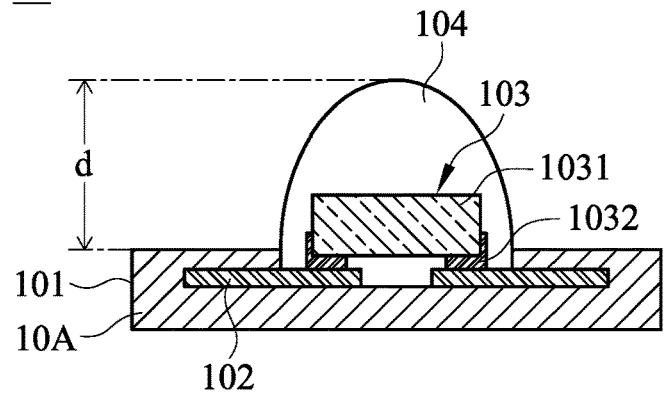

Please refer to FIGS. 1 and 2. FIG. 1 is a flowchart illustrating a method of packaging a semiconductor illumination module according to an embodiment of the present invention. FIG. 2 schematically illustrates the steps of the method of packaging the semiconductor illumination module according to the embodiment of the present invention.

Firstly, a substrate is provided (Step S101). In the step S101, the substrate 10A is a flexible printed circuit board (FPC), a metal core circuit board (MCPCB), a printed circuit board (PCB) or a ceramic printed circuit board (Ceramic PCB). The substrate comprises a solder mask layer. The solder mask layer has an opening. The opening has a width R. The solder mask layer 101 of the substrate 10 is an insulation layer. Moreover, the solder mask layer 101 is made of epoxy-hybrid material, silicone-hybrid material, epoxy resin, silicone resin, acrylic hybrid material or UV curing glue. Moreover, a circuit layer 102 is buried within the solder mask layer 101. The circuit layer 102 is made of copper. Moreover, a portion of the circuit layer 102 is exposed to the opening 1011 of the solder mask layer 101. The opening 1011 has a width R. In this embodiment, the opening 1011 of the solder mask layer 101 is produced by a solder mask defined (SMD) process or a (non-solder mask defined (NSMD) process. In this embodiment, the opening 1011 of the solder mask layer 101 is produced by the solder mask defined (SMD) process, and the width R of the opening 1011 is 0.7 mm.

Then, the light-emitting element is disposed within the opening (Step S102). In the step S102, the light-emitting element 103 is installed in the opening 1011 by a flip chip scheme. The light-emitting element 103 comprises a LED die 1031 and at least two solder pads 1032. The LED die 1031 has a light-outputting surface 10311 and a bottom surface 10312. The light-outputting surface 10311 and the bottom surface 10312 are opposed to each other. The solder pads 1032 are disposed on the bottom surface 10312. The LED die 1031 is electrically connected with the circuit layer 102 through the solder pads 1032. In other words, the wire bonding process used in the conventional package structure is not used.

Then, a packaging encapsulant is injected into the opening by using an encapsulant injection device (Step S103). In the step S103, the encapsulant injection device N is located over the light-emitting element 103. In addition, an encapsulant injection port NO is moved to the position near the LED die 1031. According to settings, a specified amount of packaging encapsulant G in a liquid state is provided from the encapsulant injection port NO within a specified time period. Consequently, the packaging encapsulant G is injected into the opening 1011 to cover the light-emitting element 103. In an embodiment, the diameter of the encapsulant injection port NO of the encapsulant injection device N is in the range between 0.1 mm and 0.2 mm. An example of the packaging encapsulant G includes but is not limited to epoxy-hybrid material, silicone-hybrid material, epoxy resin, silicone resin, acrylic hybrid material or UV curing glue. Optionally, the packaging encapsulant G contains diffusion particles. The diffusion particles are made of calcium carbonate ($CaCO_3$), titanium dioxide ($TiO_2$), silicon dioxide ($SiO_2$), aluminum oxide ($Al_2O_3$), boron nitride (BN), zinc oxide (ZnO) or zirconium oxide ($ZrO_2$). The packaging encapsulant G has the viscosity in the range between 3000 Pa·s and 8500 Pa·s and the thixotropic coefficient in the range between 1.5 and 3.0.

Then, a sealed lens structure is formed to cover the light-emitting element, wherein the sealed lens structure has a height d (Step S104). In the step S104, the height d of the sealed lens structure 104 is determined according to the width R of the opening 1011 of the solder mask layer 101, the viscosity of the packaging encapsulant G and the thixotropic coefficient of the packaging encapsulant G For example, if the width R of the opening 1011 is increased, the volume of the packaging encapsulant G to be accommodated within the opening 1011 is increased and the height d of the sealed lens structure 104 is decreased. If the viscosity and the thixotropic coefficient of the packaging encapsulant G are increased, the height d of the sealed lens structure 104 is increased. If the viscosity and the thixotropic coefficient of the packaging encapsulant G are decreased, the height d of the sealed lens structure 104 is decreased.

Figure 3:
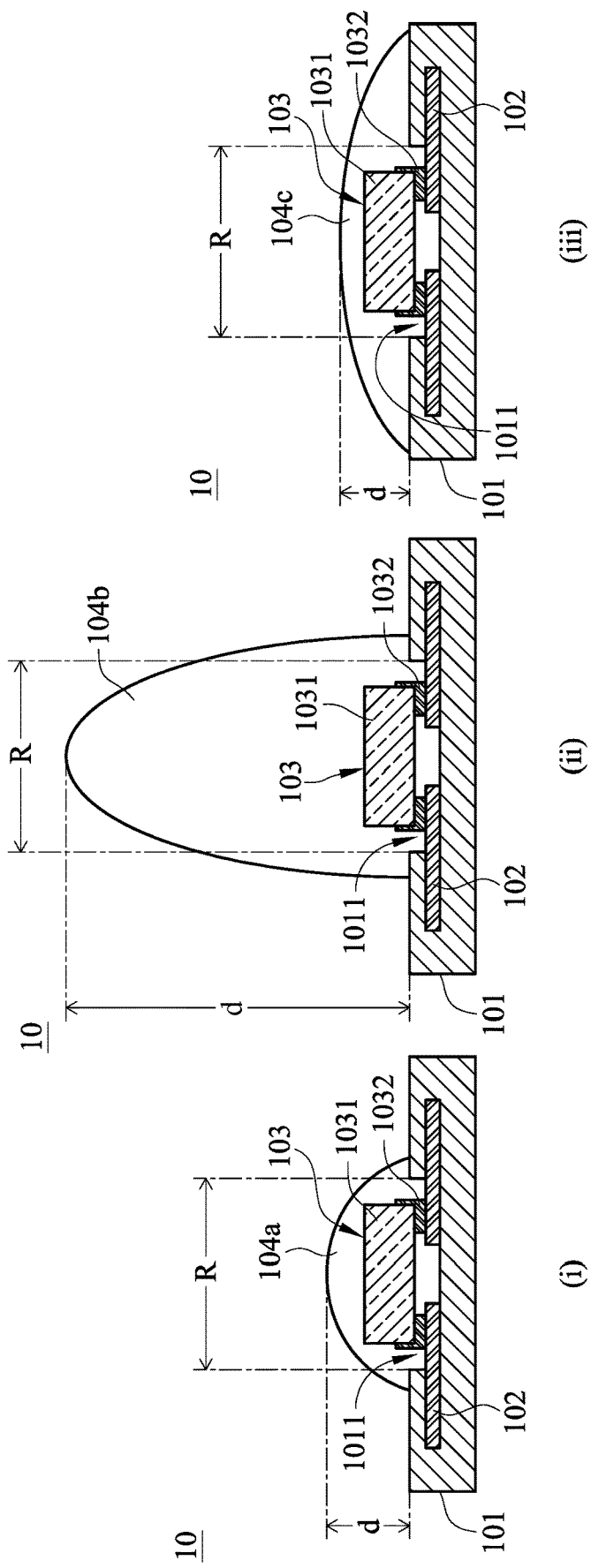
FIG. 3 is a schematic cross-sectional view illustrating some examples of the semiconductor illumination module according to the present invention.

FIG. 3 is a schematic cross-sectional view illustrating some examples of the semiconductor illumination module according to the present invention.

In a first situation, the diameter of the encapsulant injection port NO of the encapsulant injection device N is in the range between 0.1 mm and 0.2 mm, the viscosity of the packaging encapsulant G is in the range between 3000 Pa·s and 8500 Pa·s, and the thixotropic coefficient of the packaging encapsulant G is in the range between 1.5 and 3.0. After a specified amount of packaging encapsulant G is injected into the opening 1011 within a specified time period, a sealed lens structure 104a with a height d of about 0.15 mm is produced (See FIG. 3(i)).

In a second situation, the diameter of the encapsulant injection port NO of the encapsulant injection device N is in the range between 0.2 mm and 0.3 mm, the viscosity of the packaging encapsulant G is in the range between 6000 Pa·s and 15000 Pa·s, and the thixotropic coefficient of the packaging encapsulant G is in the range between 1.5 and 3.0. Since the diameter of the encapsulant injection port NO is larger, more packaging encapsulant G is injected into the opening 1011 within the specified time period. Moreover, since the viscosity of the packaging encapsulant G is higher, a sealed lens structure 104b with a height d of about 0.35 mm is produced (See FIG. 3(ii)).

For producing the sealed lens structure with the larger coverage area, the diameter of the encapsulant injection port NO is increased and the viscosity of the packaging encapsulant G is decreased. In a third situation, the diameter of the encapsulant injection port NO of the encapsulant injection device N is in the range between 0.2 mm and 0.3 mm, the viscosity of the packaging encapsulant G is in the range between 3000 Pa·s and 7000 Pa·s, and the thixotropic coefficient of the packaging encapsulant G is in the range between 1.5 and 1.9. Since the diameter of the encapsulant injection port NO is larger, more packaging encapsulant G is injected into the opening 1011 within the specified time period. Moreover, since the viscosity of the packaging encapsulant G is lower and spread to the periphery region, a sealed lens structure 104c with a height d of about 0.15 mm is produced (See FIG. 3(iii)).

When compared with the conventional technologies, the present invention provides a method of packaging a semiconductor illumination module in a simpler and quicker manner. By adjusting the opening of the solder mask layer, the diameter of the encapsulant injection port of the encapsulant injection device, the viscosity of the packaging encapsulant and the thixotropic coefficient of the packaging encapsulant, the profile and height of the sealed lens structure are changed. Consequently, the light-gathering efficiency of the light-emitting element is adjustable. In other words, the packaging method of the present invention is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A method of packaging a semiconductor illumination module, the method comprising steps of:
   (a) providing a substrate, wherein the substrate is selected from one of a flexible printed circuit board, a metal core circuit board, a printed circuit board or a ceramic printed circuit board, wherein the substrate comprises a solder mask layer with an opening, and the opening has a width R and wherein the substrate further comprises a circuit layer, and a portion of the circuit layer is exposed to the opening;
   (b) installing a light-emitting element in the opening, wherein the light-emitting element comprises at least one light emitting diode die and at least two solder pads, and the at least one light emitting diode die is electrically connected with the circuit layer through the at least two solder pads using a flip chip scheme;
   (c) using an encapsulant injection device to inject a packaging encapsulant into the opening, a viscosity of the packaging encapsulant is in a range between 3000 PA·s and 10000 Pa·s, and a thixotropic coefficient of the packaging encapsulant is in a range between 1.5 and 2.8; and
   (d) forming a sealed lens structure to cover the light-emitting element, wherein the sealed lens structure has a height h, wherein the height of the sealed lens structure is determined according to the width R of the opening of the solder mask layer, the viscosity of the packaging encapsulant, and the thixotropic coefficient of the packaging encapsulant.

2. The method according to claim 1, wherein in the step (c), the packaging encapsulant is epoxy-hybrid material, silicone-hybrid material, epoxy resin, silicone resin, acrylic hybrid material or UV curing glue.

3. The method according to claim 1, wherein in the step (a), the width R is 0.7 mm.

4. The method according to claim 3, wherein in the step (c), a diameter of an encapsulant injection port of the encapsulant injection device is in a range between 0.1 mm and 0.3 mm.

5. The method according to claim 1, wherein the diameter of the encapsulant injection port of the encapsulant injection device is in a range between 0.1 mm and 0.2 mm, the viscosity of the packaging encapsulant is in a range between 3000 Pa·s and 8500 Pa·s, and the thixotropic coefficient of the packaging encapsulant is in a range between 1.5 and 3.0, so that the height h of the sealed lens structure is about 0.15 mm.

6. The method according to claim 1, wherein the diameter of the encapsulant injection port of the encapsulant injection device is in a range between 0.2 mm and 0.3 mm, the viscosity of the packaging encapsulant is in a range between 6000 Pa·s and 15000 Pa·s, and the thixotropic coefficient of the packaging encapsulant is in a range between 2.4 and 3.0, so that the height h of the sealed lens structure is about 0.35 mm.

7. The method according to claim 1, wherein the diameter of the encapsulant injection port of the encapsulant injection device is in a range between 0.2 mm and 0.3 mm, the viscosity of the packaging encapsulant is in a range between 3000 Pa·s and 7000 Pa·s, and the thixotropic coefficient of the packaging encapsulant is in a range between 1.5 and 1.9, so that the height h of the sealed lens structure is about 0.15 mm.

8. The method according to claim 1, wherein in the step (c) the packaging encapsulant contains diffusion particles, and the diffusion particles are made of calcium carbonate ($CaCO_3$), titanium dioxide ($TiO_2$), silicon dioxide ($SiO_2$), aluminum oxide ($Al_2O_3$), boron nitride (BN), zinc oxide (ZnO) or zirconium oxide ($ZrO_2$).

* * * * *